Nov. 13, 1962 J. A. WORCESTER 3,064,202

LOW CURRENT DRAIN TRANSISTOR AMPLIFIER

Filed Jan. 27, 1959 2 Sheets-Sheet 1

Inventor:
Joseph A. Worcester,
by Laurence R. Kempton
His Attorney.

LOW CURRENT DRAIN TRANSISTOR AMPLIFIER

Filed Jan. 27, 1959 2 Sheets-Sheet 2

Inventor:
Joseph A. Worcester,
by Laurence R. Kempton
His Attorney.

3,064,202

LOW CURRENT DRAIN TRANSISTOR AMPLIFIER

Joseph A. Worcester, Utica, N.Y., assignor to General Electric Company, a corporation of New York Filed Jan. 27, 1959, Ser. No. 789,374
8 Claims. (Cl. 330—29)

My invention relates to transistor audio amplifiers and more particularly to single-ended transistor audio power amplifiers.

In Class A transistor amplifiers the bias is such that collector current flows throughout the entire electrical cycle. While the efficiency of a Class A amplifier is good under operating conditions, the collector current dissipation is approximately the same whether or not a signal is applied, and its efficiency for intermittent or stand-by operation is therefore poor. The continuous collector current dissipation under non-operating conditions makes the use of Class A transistor amplifiers uneconomical as audio power amplifiers in battery-powered radio receivers inasmuch as the continuous current drain greatly shortens the battery life. The most obvious answer to this problem, and the one commonly used at the present time, is the use of push-pull transistors operating Class B as the audio power amplifier in a transistor radio receiver. Such an audio amplifying arrangement has the advantage of relatively higher efficiency over a Class A amplifier because there is little collector current dissipation when there is no signal input. A Class B amplifier is therefore particularly desirable where batteries are used to power the amplifier, as in portable equipment, and also in applications requiring a minimum of heat generation and high power output. Actually, most transistor Class B audio amplifiers are in reality operated Class AB, to avoid the possibility of distortion at low input levels.

The advantages of the Class B amplifier over the Class A amplifier are often offset because the Class B transistor amplifier requires a tapped input transformer, a tapped output transformer and two transistors. These necessary elements greatly increase the cost of a transistor radio receiver in themselves and also require more circuit components and more space than if a single-ended Class A transistor amplifier were used. The requirement for more space is undesirable especially in smaller portable and pocket model transistor radio receivers.

To avoid the requirement for a tapped input transformer in Class B transistor amplifiers, an alternative arrangement known in the art as complementary symmetry, using one NPN and on PNP transistor, has been proposed. The input to such an amplifying arrangement may be directly coupled to the output of a driving stage, thereby avoiding the use of an input transformer. Unfortunately, the use of complementary transistors as an audio output amplifier has its own peculiar problems and has not been found suitable for appreciable application in radio receivers at the present time.

In overcoming the above-mentioned limitation in prior art transistor audio amplifiers, I utilize a single-ended transistor amplifier biased to a low quiescent current at no-signal conditions and provide means to render the transistor sufficiently conductive to handle large amplitude incoming signals by automatically varying the bias on the input electrode in accordance with the syllabic content of the output audio signal. By syllabic content, I mean the amplitude variation of the audio signal, but not the audio frequency variations. In varying the bias in this manner, the operating point of the transistor is caused to move along the transistor load line in accordance with the syllabic content of the output audio signal.

Accordingly, it is an object of my invention to provide a single-ended transistor audio output amplifier which combines the efficiency of Class B push-pull operation and the economy of single-ended Class A operation.

It is another object of my invention to provide a single-ended transistor audio amplifier having negligible current drain when a no-signal-input condition exists.

It is a further object of my invention to provide a single-ended transistor audio output amplifier which does not require an input transformer or a tapped output transformer.

It is a still further object of my invention to provide a transistor audio amplifier which has a minimum number of circuit elements, occupies little space, and is economical both as to original cost and operational cost.

These and other objects of my invention are achieved in a novel transistor amplifier wherein the input electrode is coupled to the output of a driving stage and is so biased that there is little or no current drain when a no-signal condition exists. To eliminate undesirable current drain the bias on the input electrode is made to vary with the syllabic content of the output audio by rectifying a portion of the output signal when that signal reaches a predetermined level, removing the audio variations of the rectified signal to give a variable direct potential indicative of the syllabic content of the output audio, and applying this direct potential to the input electrode to vary the bias thereon and thereby have appreciable collector current flow only in the presence of an input signal.

The features of the invention which are believed to be novel are set forth with particularity in the appended claims. The invention itself, however, both as to its organization and method of operation together with further objects and advantages thereof, may best be understood by reference to the following description when taken in connection with the drawing in which:

Figure 1:
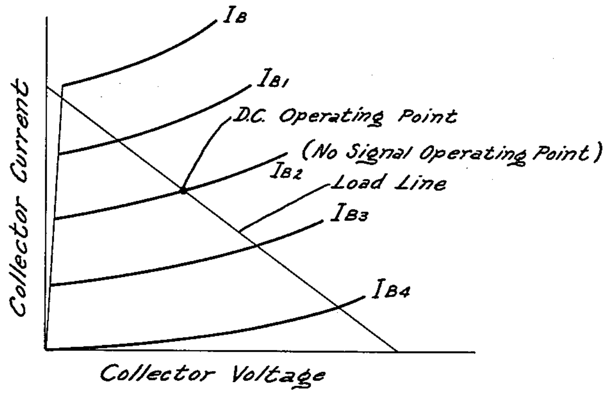
FIG. 1 shows a typical collector characteristic for a Class A transistor amplifier.

Referring now to FIG. 1 which shows a typical collector characteristic for a Class A transistor amplifier, the curves represent a plot of collector current versus collector voltage for various values of base current, designated as $I_B$, $I_{B1}$, $I_{B2}$, etc. The slope of the load line is determined by the load resistance. The D.C. operating point is so chosen that the output signal can swing equally in the positive or negative direction; this means that the current dissipated by the collector will be approximately the same whether or not a signal is applied. In Class A operation the D.C. operating point does not vary.

Figure 2:
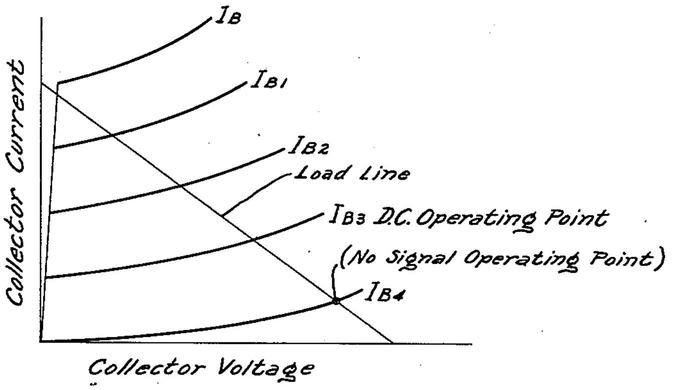
FIG. 2 shows a typical collector characteristic for a transistor operating in a Class B push-pull arrangement.

FIG. 2 shows a typical collector characteristic of a transistor operating Class B in a push-pull amplifier. Since each transistor conducts only during one polarity of an input signal, the transistor need not be biased conductive when the second transistor is conducting. This condition is illustrated in FIG. 2 by the location of the no-signal operating point on the load line. It will be noted by comparison of FIGS. 1 and 2 that in the no-signal condition the collector current is substantially less for Class B operation than for Class A operation. For true Class B operation there is actually no collector current with no-signal input; however, to avoid distortion the transistor is biased to conduct slightly when no signal is applied. With the application of an input signal the base bias is affected and the operating point moves along the load line in accordance with the base current. In Class B operation there is, therefore, substantially no current drain in the absence of an input signal.

The characteristics in FIGS. 1 and 2 are for purposes of illustration and orientation only, and do not necessarily represent the collector characteristics of a transistor audio amplifier embodying the present invention. The present invention contemplates affecting the base bias current of a transistor audio amplifier in accordance with the syllabic content of an output audio signal to vary the base bias current and move the D.C. operating point of the transistor along the collector characteristic load line in accordance with the syllabic variations of the audio output signal, thereby minimizing the collector current during intermittent and stand-by operation and at low input signal intensities.

Figure 3:
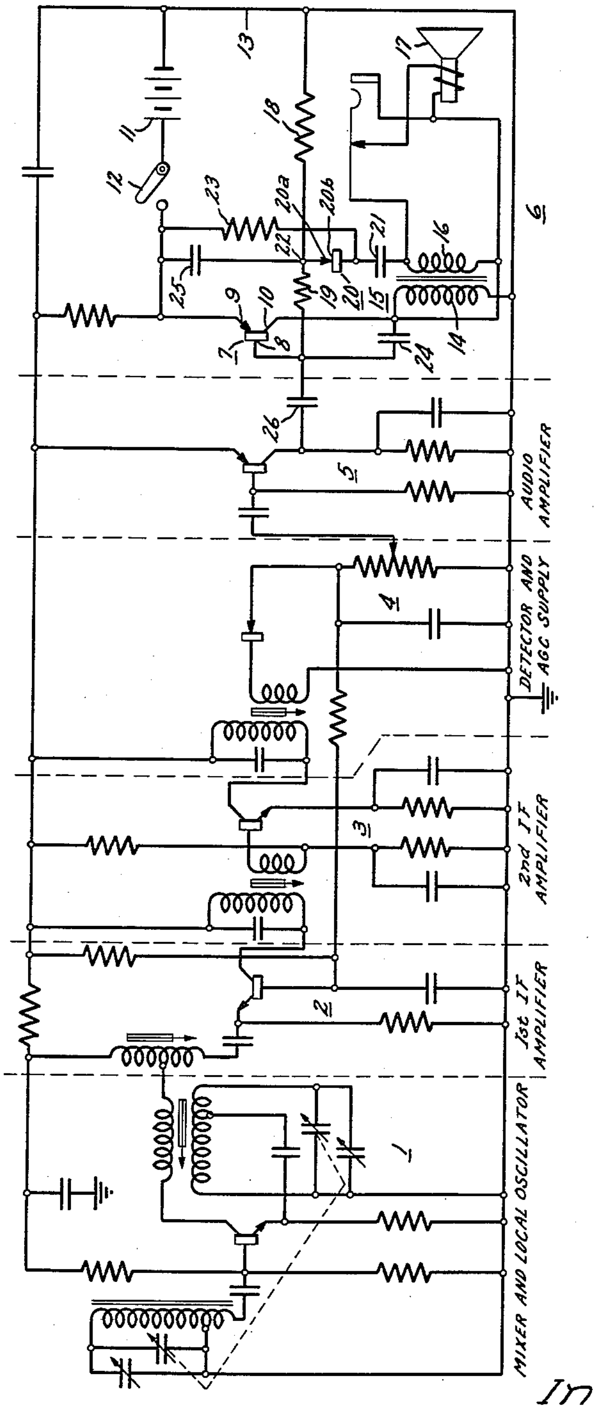
FIG. 3 illustrates a transistor radio receiver having an audio output stage embodying my invention.

Reference is now made to FIG. 3 which shows a radio receiver comprising a mixer and local oscillator 1 coupled to a first IF amplifier 2, which is in turn transformer-coupled to a second IF amplifier 3. The output of the second IF amplifier is applied to a detector 4 and the detected signal is applied to a first audio amplifier or driver 5 through a volume control variable resistor. Provision is made for automatic gain control by returning a portion of the detected signal to the base of the transistor comprising the first IF amplifier. The automatic gain control arrangement is disclosed and claimed in my co-pending application Serial No. 788,637, filed January 23, 1959, now Patent No. 3,007,047, and assigned to the General Electric, assignee of the present application. The output of driver 5 is coupled to audio output amplifier 6 by means of a coupling capacitor 26.

The overall radio receiver circuit does not form any part of the present invention and has been shown merely for purposes of illustration and orientation. The present invention resides in the audio output amplifier 6 which comprises a transistor 7, shown as a PNP transistor having a base 8, an emitter 9 and a collector 10. The emitter is biased positive by battery 11 when OFF/ON switch 12 is closed; the collector is biased negative with respect to the emitter by battery 11 over line 13 and through the primary winding 14 of output transformer 15. The secondary 16 of the output transformer 15 drives a speaker 17. The base 8 is biased slightly less positive than the emitter by battery 11 connected over line 13 through resistors 18 and 19 connected to the base. A unidirectional conducting device 20 is coupled to the output winding 16 through coupling capacitor 21. The anode 20*a* of device 20 is connected to point 22 between resistors 18 and 19, where the potential is slightly less positive than the potential at the base 8. The cathode 20*b* of device 20 is biased slightly more positive than the anode by means of biasing resistor 23 connected between cathode 20*b* of device 20 and D.C. source 11. A capacitor 24, having a relatively small value of capacitance, is connected between the collector and base electrodes to provide degenerative feedback at the higher frequencies to stabilize the transistor.

In the absence of an input signal the bias on the base electrode is such that there is negligible current flow in the collector and, therefore, negligible current drain on the battery 11. By the term "negligible" current, I mean relatively little current as compared with the amount of current required for satisfactory operation when an appreciable signal is present. Upon application of a signal to the base 8 from driver stage 5 current flows in the collector circuit and an audio voltage appears across winding 16 of transformer 15. A portion of this audio signal is passed by capacitor 21 and applied to back biased diode 20. Assuming the amplitude of the negative swing of the signal passed by capacitor 21 is sufficient to render the cathode 20*b* of device 20 negative with respect to the anode 20*a*, a D.C. current having audio frequency variations is passed by device 20. Audio frequency variations in the rectified signal are removed by filtering action of capacitor 25, which has a sufficient value of capacitance to remove the audio variations but it is not so large in magnitude as to affect the amplitude variations of the rectified audio signal. The amplitude variation is thus indicative of the syllabic content of the audio signal appearing across transformer secondary winding 16. Inasmuch as the base 8 is positive with respect to point 22, the syllabically varying current flows to the base 8 through the resistor 19 in a direction rendering the base more negative with respect to the emitter 9, thereby causing the transistor to become more conductive.

The varying base bias current causes the operating point of the transistor to move along the collector characteristic load line in a Class B manner as pointed out in the discussion of FIG. 2. The operating point of the transistor now moves along the load line in accordance with the syllabic content of the output signal, and thereby affects the battery drain in a like manner.

In the absence of an input signal to base electrode 8 the base bias is of such value that a small, almost negligible, collector current flows. Under this condition unidirectional conducting device 20 is biased non-conductive and the base bias remains constant. In practice it is desirable to have a small amount of conduction through the transistor at very low signal levels in order to avoid distortion of the signal at such low levels. This is then the quiescent condition of the transistor and may be represented by the no-signal operating point shown in FIG. 2.

One important precaution must be taken in the circuit design and that is the time constant of the diode output circuit comprising capacitor 25 and resistor 19 must be just large enough to prevent feedback of low frequency audio signals, but not greatly larger than this, so that the base bias circuit operates without observable delay from a syllabic standpoint. It is also important that the unidirectional conducting device 20 be so biased that it starts to conduct just before the maximum undistorted output permitted by quiescent current alone is approached. If the diode operates prior to this point the transistor will be biased more conductive than is required to handle the audio signal and excessive battery drain will be experienced. If the diode operates subsequent to this point the transistor will not be biased sufficiently conductive to handle the dynamic signal applied and distortion will result.

From the foregoing description and discussion of a transistor audio output amplifier it may be seen that I have made provision for operating a single-ended transistor audio amplifier in a Class B manner thereby greatly increasing its efficiency. The proper bias on the anode 20*a* of diode 20 may be obtained by proper selection of resistance values of resistors 18 and 19. The sum of the resistance of these resistors determines the no-signal bias on base 8; however, the relative values of resistors 18 and 19 determines the potential at point 22. For example, if resistor 18 is made smaller in value and resistor 19 made larger in value the potential of point 22, and hence the anode 20*a* of device 20, will be moved closer to ground and the cut-off bias will be increased since the diode cathode returns to the positive potential source 11 through resistor 23.

By controlling the value of resistor 23 it is possible to regulate the percentage of the total control voltage developed by the diode 20 that is utilized to bias the base 8. The larger the value of this resistor the smaller will be the potential applied to the transistor. The selection of the proper resistance for resistor 23 is important inasmuch as gain of production transistors varies over wide limits. For a low gain transistor the audio voltage in the collector circuit will be low and nearly all the developed control potential may be required to provide sufficient operating bias upon base electrode 8. On the other hand, very high gain units will provide control bias greatly in excess of requirements and resistor 23 may have to be increased substantially.

By way of example only, the following tabulation shows types and values of components which have been successfully used in an audio amplifier embodying my invention:

| | |
|---|---|
| Transistor 7 | 2N241A. |
| Battery 11 | 4.5 volts. |
| Capacitor 21 | 3 mf. |
| Capacitor 25 | 3 mf. |
| Capacitor 24 | .003 mf. |
| Diode 20 | 1N87G. |
| Resistor 18 | 39K. |
| Resistor 19 | 2.7K. |
| Resistor 23 | 1 to 10K. |

While I have illustrated a particular embodiment of my invention it should be understood that variations thereof will occur to those skilled in the art and it is, therefore, intended that the invention not be limited to the particular embodiment shown and described, but it is intended in the appended claims to claim all such variations as fall within the spirit of the present invention.

What I claim as new and desire to secure by Letters Patent of the United States is:

1. In a transistor audio amplifier having a base and a collector wherein an input signal is applied to the base and an audio output signal derived from the collector is coupled to an output circuit, means to operate the transistor amplifier in a Class B manner comprising: means to establish a D.C. operating point for the transistor wherein the quiescent current of the transistor is relatively small whereby signal distortion would occur when said input signal has an amplitude greater than a relatively small value, means to rectify a portion of the audio ouput signal when the audio output signal exceeds a predetermined magnitude, means to remove audio frequency variations from the rectified signal to derive a unidirectional current varying in amplitude in accordance with the syllabic variations of the audio output signal, and means to apply the syllabically varying current to the base to affect the D.C. operating point of the transistor so as to cause the transistor current to increase in accordance with the syllabic variations of the output signal at a rate whereby said amplifier will amplify said input signal without distortion, said operating point being varied along a substantially linear amplification characteristic of said transistor whereby the amplification factor of said transistor is substantially unaffected by said increase in transistor current.

2. In a transistor audio amplifier having a base and a collector wherein an input signal is applied to the base and an audio output signal derived from the collector is coupled to an output circuit, means to operate the transistor amplifier in a Class B manner comprising: means to establish a D.C. operating point for the transistor wherein the quiescent current of the transistor is relatively small whereby signal distortion would occur when said input signal has an amplitude greater than a relatively small value, a unidirectional conducting device connected to the output circuit and biased to conduct only when the audio output signal exceeds a predetermined magnitude, an RC circuit connected to the output of said device to remove audio frequency variations of the output unidirectional current and derive a unidirectional current varying in amplitude in accordance with the syllabic variations of the audio output signal, and means to apply the syllabically varying current to the base to affect the D.C. operating point of the transistor so as to cause the transistor current to increase in accordance with the syllabic variations of the audio output signal at a rate whereby said amplifier will amplify said input signal without distortion, said operating point being varied along a substantially linear amplification characteristic of said transistor whereby the amplification factor of said transistor is substantially unaffected by said increase in transistor current.

3. In a transistor audio amplifier having a base and a collector wherein an input signal is applied to the base and an audio output signal derived from the collector is coupled to an output circuit, means to operate the transistor amplifier in a Class B manner comprising: resistance means to establish a D.C. operating point for the transistor wherein the quiescent current of the transistor is relatively small whereby signal distortion would occur when said input signal has an amplitude greater than a relatively small value, a unidirectional conducting device connected to the output circuit and biased to conduct only when the audio output signal exceeds a predetermined magnitude, an RC circuit including a portion of said resistance means connected to the output of said device to remove audio frequency variations of the output unidirectional current and derive a unidirectional current varying in amplitude in accordance with syllabic variations of the audio output signal, and means to apply the syllabically varying current to the base to affect the D.C. operating point of the transistor so as to cause the transistor current to increase in accordance with the syllabic variations of the audio output signal at a rate whereby said amplifier will amplify said input signal without distortion, said operating point being varied along a substantially linear amplification characteristic of said transistor whereby the amplification factor of said transistor is substantially unaffected by said increase in transistor current.

4. In a transistor audio amplifier having a base and a collector wherein an input signal is applied to the base and an audio output signal derived from the collector is coupled to an output circuit, means to operate the transistor amplifier in a Class B manner comprising: means to establish a D.C. operating point for the transistor wherein the quiescent current of the transistor is relatively small whereby signal distortion would occur when said input signal has an amplitude greater than a relatively small value, a unidirectional conducting device connected to the output circuit, said device being back biased to a predetermined potential so as to become conductive when the maximum undistorted output permitted by the quiescent current alone is approached, means to remove audio frequency variations from the current passed by said device to derive a unidirectional current varying in amplitude in accordance with the syllabic variations of the audio output signal, and means to apply the syllabically varying current to the base to affect the D.C. operating point so as to cause the transistor current to increase in accordance with the syllabic variations of the output signal at a rate whereby said amplifier will amplify said input signal without distortion, said operating point being varied along a substantially linear amplification characteristic of said transistor whereby the amplification factor of said transistor is substantially unaffected by said increase in transistor current.

5. In a transistor audio amplifier having a base and a collector wherein an input signal is applied to the base and an audio output signal derived from the collector is coupled to an output circuit, means to operate the transistor amplifier in a class B manner comprising: resistance means to establish a D.C. operating point for the transistor wherein the quiescent current of the transistor is relatively small whereby signal distortion would occur when said input signal has an amplitude greater than a relatively small value, a unidirectional conducting device connected to the output circuit, said device being back biased to a predetermined potential so as to become conductive when the maximum undistorted output permitted by the quiescent current alone is approached, an RC circuit including a portion of said resistance means connected to the output of said device to remove audio frequency variations of the output unidirectional current varying in amplitude in accordance with the syllabic variations of the audio output signal, and means to apply the unidirectionally varying current to the base to affect the D.C. operating point of the transistor so as to cause the transistor current to increase in accordance with the magnitude of said unidirectionally varying current at a rate whereby said amplifier will amplify said input signal without distortion, said operating point being varied along a substantially linear amplification characteristic of said transistor whereby the amplification factor of said transistor is substantially unaffected by said increase in transistor current.

6. In a transistor audio amplifier having a base and a collector wherein an input signal is applied to the base and an audio output signal derived from the collector is coupled to an output circuit, means to operate the transistor amplifier in a Class B manner comprising: resistance means to establish a D.C. operating point for the transistor wherein the quiescent current of the transistor is relatively small whereby signal distortion would occur when said input signal has an amplitude greater than a relatively small value, a unidirectional conducting device connected to the output circuit, said device being back biased to a predetermined potential so as to become conductive when the maximum undistorted output permitted by the quiescent current alone is approached, an RC circuit including a portion of said resistance means connected to the output of said device to remove audio frequency variations of the output unidirectional current, the capacitor of said RC circuit being of such value of capacitance as to remove audio frequency variations of the output unidirectional current but of insufficient value to affect the amplitude variations of the output current of said device, and means to apply the unidirectionally varying current to the base to affect the D.C. operating point of the transistor so as to cause the transistor current to increase in accordance with the magnitude of said unidirectionally varying current at a rate whereby said amplifier will amplify said input signal without distortion, said operating point being varied along a substantially linear amplification characteristic of said transistor whereby the amplification factor of said transistor is substantially unaffected by said increase in transistor current.

7. A low current drain transistor amplifier comprising a transistor having base, emitter and collector electrodes, a signal input circuit connected to said base electrode, means for connecting a terminal of a battery to said emitter electrode, a transformer having a primary winding connected between said collector electrode and another terminal of said battery, means establishing a D.-C. operating point for said transistor wherein the quiescent current of the transistor is relatively small whereby signal distortion would occur when an input signal has an amplitude greater than a relatively small value, a rectifier circuit having input and output terminals, said transformer having a secondary winding connected between said collector electrode of the transistor and said input terminal of the rectifier circuit thereby to apply the output signal of said amplifier to said rectifier circuit, said rectifier circuit being adapted to rectify only said amplifier output signals which exceed a predetermined magnitude, said rectifier circuit including a filter connected to remove signal frequencies at the output of the rectifier circuit, and means connecting the filtered output signal of said rectifier circuit to said base electrode of the transistor to affect the D.-C. operating point of the transistor to cause the transistor current to increase in accordance with increased magnitude of said input signal at a rate whereby said amplifier will amplify the input signal without distortion, said operating point being varied along a substantially linear amplification characteristic of said transistor whereby the amplification factor of said transistor is substantially unaffected by said increase in transistor current.

8. An amplifier as claimed in claim 7, in which said rectifier circuit comprises a capacitor and rectifier connected in the named order between the input and output terminals of the rectifier circuit, a resistor connected between said output terminal and said other battery terminal, a capacitor connected between said output terminal and the first-named battery terminal, and a resistor connected between said first-named battery terminal and the junction of said rectifier and the first-named capacitor.

References Cited in the file of this patent

UNITED STATES PATENTS

| | | |
|---|---|---|
| 1,979,034 | Hammond | Oct. 30, 1934 |
| 1,979,037 | Hammond | Oct. 30, 1934 |
| 2,143,689 | Dome | Jan. 10, 1939 |
| 2,175,990 | Hirsch | Oct. 10, 1939 |
| 2,262,841 | Goddard | Nov. 18, 1941 |
| 2,361,889 | Walsh | Oct. 31, 1944 |
| 2,527,406 | Donker | Oct. 24, 1950 |
| 2,544,340 | Maxwell | Mar. 6, 1951 |
| 2,847,519 | Aronson | Aug. 12, 1958 |
| 2,891,145 | Bradmiller | June 16, 1959 |
| 2,937,340 | Holmes | May 17, 1960 |

FOREIGN PATENTS

| | | |
|---|---|---|
| 1,182,706 | France | Jan. 19, 1959 |